United States Patent
Kim et al.

(10) Patent No.: US 8,319,672 B2
(45) Date of Patent: Nov. 27, 2012

(54) DECODING DEVICE FOR CONTEXT-BASED ADAPTIVE BINARY ARITHMETIC CODING (CABAC) TECHNIQUE

(75) Inventors: Dong-Sun Kim, Seongnam-si (KR); SeungYerl Lee, Seongnam-si (KR); Tae-Ho Hwang, Seoul (KR); Byung-Ho Choi, Yongin-si (KR)

(73) Assignee: Korea Electronics Technology Institute, Seongnam-si, Gyeonggi-do (KR)

( * ) Notice: Subject to any disclaimer, the term of this patent is extended or adjusted under 35 U.S.C. 154(b) by 59 days.

(21) Appl. No.: 13/083,063

(22) Filed: Apr. 8, 2011

(65) Prior Publication Data

US 2011/0248871 A1    Oct. 13, 2011

Related U.S. Application Data

(60) Provisional application No. 61/322,704, filed on Apr. 9, 2010.

(51) Int. Cl.
*H03M 7/00* (2006.01)

(52) U.S. Cl. .......................................... 341/107; 341/106
(58) Field of Classification Search .................. 341/107, 341/106, 50, 51; 375/240.25, 240.24; 382/244, 382/247; 717/141, 114, 162
See application file for complete search history.

(56) References Cited

U.S. PATENT DOCUMENTS 7,932,843 B2 *  4/2011  Demircin et al. .............. 341/107
* cited by examiner

*Primary Examiner* — Joseph Lauture
(74) *Attorney, Agent, or Firm* — Lowe Hauptman Ham & Berner, LLP

(57) ABSTRACT

A decoding device is suitable for a context-based adaptive binary arithmetic coding (CABAC) technique and allows a real-time decoding of high-definition video. The CABAC decoding device allows a simultaneous performing since determination according to multiple conditions is based on logic circuits when the device is formed in hardware. Additionally, when one macro block starts to be decoded, the device reads and stores information about neighboring macro blocks at a time from a memory. Therefore, the device does not need to access the memory at every operation and this improves the overall decoding speed.

8 Claims, 3 Drawing Sheets

DECODING DEVICE FOR CONTEXT-BASED ADAPTIVE BINARY ARITHMETIC CODING (CABAC) TECHNIQUE

BACKGROUND OF THE INVENTION

1. Field of the Invention

The present invention relates to a decoding device suitable for a context-based adaptive binary arithmetic coding (CABAC) technique allowing a real-time decoding of high-definition video.

2. Description of the Related Art

H.264/AVC (Advanced Video Coding) is a video compression standard developed by the ITU-T VCEG (Video Coding Experts Group) together with the ISO/IEC MPEG (Moving Picture Experts Group) and advantageously provides more effective video compression and enough flexibility for a wide variety of network environments.

H.264/AVC realizes higher compression efficiency through advanced entropy encoding schemes including context-based adaptive variable length coding (CAVLC) that selects a table according to circumstances of neighbor blocks and thereby performs a coding, and context-based adaptive binary arithmetic coding (CABAC) that estimates probability adapted to circumstances of neighbor blocks and thereby performs an arithmetic coding.

Among them, CABAC has better compression efficiency than CAVLC and, contrary to CAVLC, encodes other syntax elements in a slice as well as DCT coefficient.

FIG. 1 shows a basic structure of a normal CABAC encoding device. Referring to FIG. 1, the CABAC encoding device performs a binarization of syntax elements through a binarization unit 110 and then, through a binary arithmetic coding unit 130, performs a binary arithmetic coding of binary signals outputted from the binarization unit 110. At this time, a context modeling unit 120 calculates the probability of occurrence of binary signals according to surrounding circumstances and offers it to the binary arithmetic coding unit 130. Then the binary arithmetic coding unit 130 performs a binary arithmetic coding of binary signals while referring to a probability value.

However, in case where video images are encoded through CABAC with good compression efficiency, a decoding may require too much higher processing speed. Specifically, due to characteristics of BAC, a single bin (i.e., a single bit forming a bin string corresponding to a symbol in a binarization process) should be completely decoded in order for the next bin to start to be decoded. Unfortunately, this may make it difficult to realize a parallel processing in a CABAC decoding process.

BRIEF SUMMARY OF THE INVENTION

Accordingly, the present invention is to address the above-mentioned problems and/or disadvantages and to offer at least the advantages described below.

An aspect of the present invention is to provide a CABAC decoding device allowing a real-time decoding of high-definition video.

According to one aspect of the present invention, provided is a context-based adaptive binary arithmetic coding (CABAC) decoding device comprising: a bit stream buffer configured to receive and store a bit stream having a specific size; a register bank configured to store a current macro block to be decoded and neighboring macro blocks; a context selector configured to have a context model table that contains context indexes and correlated context model values, to calculate the context index that indicates the context model while referring to information about the current macro block and the neighboring macro blocks stored in the register bank, and to select the context model in the context model table by using the calculated context index; a binary arithmetic decoder configured to receive the bit stream from the bit stream buffer, to receive the selected context model from the context selector, and to perform a binary arithmetic decoding of the received bit stream according to the received context model; and an inverse binarization unit configured to check whether bits outputted from the binary arithmetic decoder are a valid bit string, and if the bit string is valid, to perform an inverse binarization for the bit string and then output a syntax element value.

The CABAC decoding device may further comprise a context updater configured to update the context model in the context model table whenever a single bit is decoded.

Also, the CABAC decoding device may further comprise an address calculator configured to calculate addresses at which the current macro block and the neighboring macro blocks are stored. The address calculator may include a first part for calculating the address of the current macro block, and a second part for calculating the addresses of the neighboring macro blocks required for selecting the context model on the basis of the calculated address of the current macro block.

Also, the CABAC decoding device may further comprise a status register configured to store additive information necessary for a decoding, the additive information including at least one of a screen size and a CABAC initialization factor.

In the CABAC decoding device, the register bank may be further configured to read and store information about the current macro block and the neighboring macro blocks at a time from a memory when one macro block starts to be decoded.

Also, in the CABAC decoding device, the context model may include a most probable symbol (MPS) value that indicates which of binary signals has a higher probability of occurrence, and probability index information that indicates the probability of occurrence of the MPS.

Also, in the CABAC decoding device, the binary arithmetic decoder and the inverse binarization unit may simultaneously operate.

According to aspects of the present invention, since determination according to multiple conditions is based on logic circuits, the CABAC decoding device allows a simultaneous performing when formed in hardware. Additionally, since the register bank reads and stores information about neighboring macro blocks at a time from the memory when one macro block starts to be decoded, the context selector may not need to access a memory at every operation. This may considerably improve the overall decoding speed.

The CABAC decoding device of this invention may be applied to a next-generation digital television and the like requiring higher performance and also allow CABAC with higher compression efficiency to be available for SVC (Scalable Video Codec) that offers various layers.

Other aspects, advantages, and salient features of the invention will become apparent to those skilled in the art from the following detailed description, which, taken in conjunction with the annexed drawings, discloses exemplary embodiments of the invention.

DETAILED DESCRIPTION OF THE INVENTION

Exemplary, non-limiting embodiments of the present invention will now be described more fully with reference to the accompanying drawings. This invention may, however, be embodied in many different forms and should not be construed as limited to the exemplary embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

Furthermore, well known or widely used techniques, elements, structures, and processes may not be described or illustrated in detail to avoid obscuring the essence of the present invention. Although the drawings represent exemplary embodiments of the invention, the drawings are not necessarily to scale and certain features may be exaggerated or omitted in order to better illustrate and explain the present invention.

Figure 1:
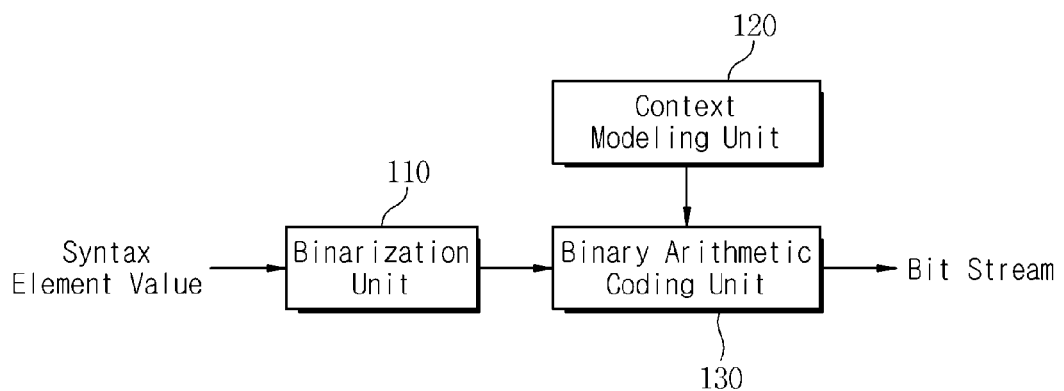
FIG. 1 is a block diagram illustrating a basic structure of a normal CABAC encoding device.
Figure 2:
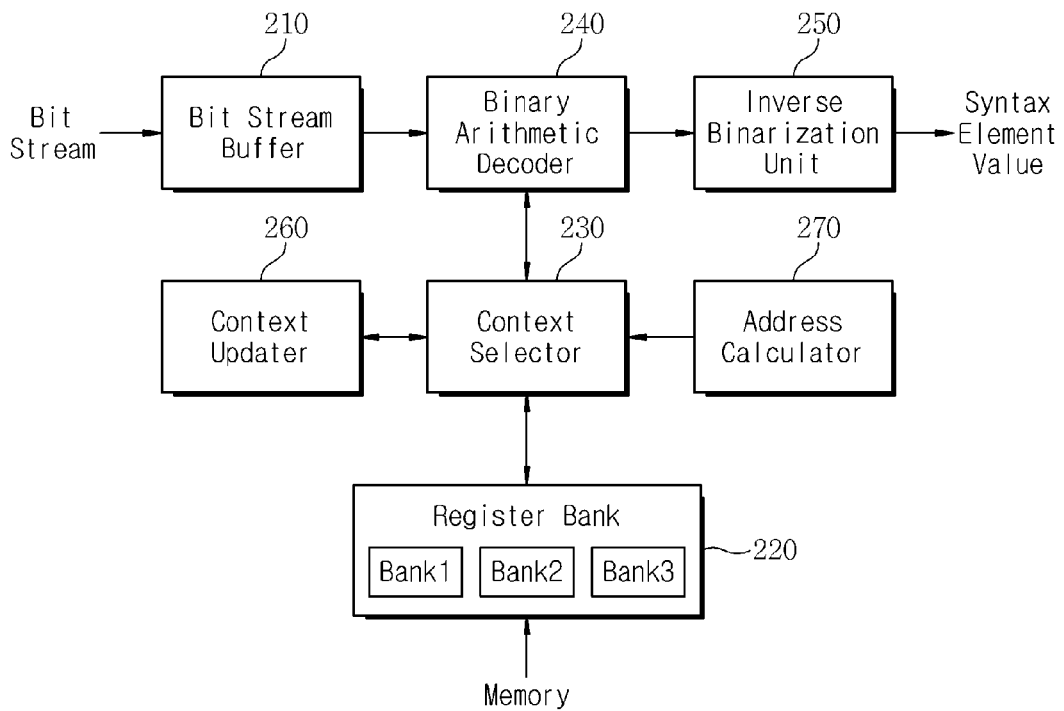
FIG. 2 is a block diagram illustrating the configuration of a CABAC decoding device in accordance with an exemplary embodiment of the present invention.

FIG. 2 is a block diagram illustrating the configuration of a CABAC decoding device in accordance with an exemplary embodiment of the present invention.

Referring to FIG. 2, the CABAC decoding device according to an embodiment of this invention includes a bit stream buffer 210, a register bank 220, a context selector 230, a binary arithmetic decoder 240, an inverse binarization unit 250, a context updater 260, and an address calculator 270.

The above-structured CABAC decoding device decodes all syntax elements below the level of a slice, and a decoding process in the CABAC decoding device is controlled by means of a single finite state machine (FSM). An upper FSM controls a lower FSM for controlling a decoding of a single syntax element, and the lower FSM controls respective elements by creating control signals for a CABAC decoding.

The above-mentioned elements of the CABAC decoding device may be classified into one part for performing a decoding and the other part for offering information for a decoding. The former includes the context selector 230, the binary arithmetic decoder 240 and the inverse binarization unit 250, whereas the latter includes the other elements.

The bit stream buffer 210 receives and stores a bit stream to be decoded, and also offers the stored bit stream to the binary arithmetic decoder 240. The reason why a bit stream is offered to the binary arithmetic decoder 240 through the bit stream buffer 210 is to update a code offset value when a decoding is performed. The bit stream buffer 210 may be formed of, for example, a 32-bit sized buffer. The bit stream buffer 210 reads a new bit stream whenever the buffer is empty, and in this case a decoding process is stopped.

The binary arithmetic decoder 240 performs a binary arithmetic decoding of a bit stream offered by the bit stream buffer 210, depending on a context model offered by the context selector 230. A context model includes a most probable symbol (MPS) value that indicates which of binary signals 0 and 1 has a higher probability of occurrence, and probability index information that indicates the probability of occurrence of the MPS. Namely, a context model tells the MPS and its probability of occurrence to the binary arithmetic decoder 240. Therefore, depending on a context model, the binary arithmetic decoder 240 decodes an input bit stream.

The context selector 230 calculates a context index that indicates a corresponding context model, while referring to information about a current macro block to be decoded and neighboring macro blocks. Also, the context selector 230 selects a context model according to the calculated context index and then offers it to the binary arithmetic decoder 240. For this, the context selector 230 stores a context model table that contains context indexes and correlated context model values. The context selector 230 retrieves information about a current macro block and neighboring macro blocks from the register bank 220.

The register bank 220 stores information about a current macro block and information about neighboring macro blocks when a decoding for any macro block is started in the CABAC decoding process.

Figure 4:
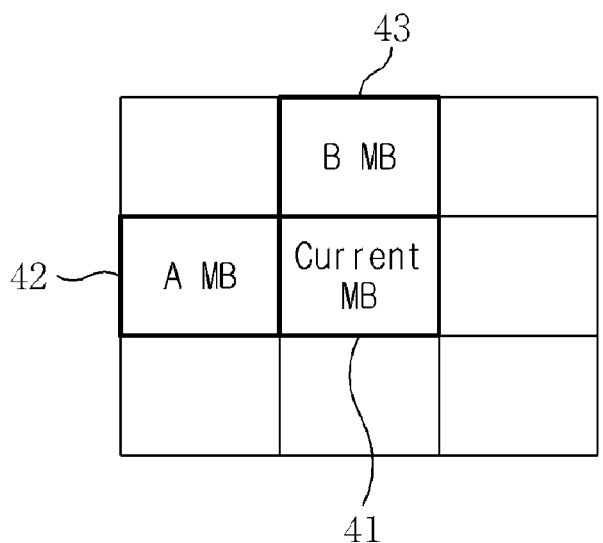
FIG. 4 is a diagram illustrating neighboring macro blocks in a CABAC decoding process.

Specifically, in most cases, neighboring macro blocks to be referred for a selection of a context model are the A macro block 42 and the B macro block 43 located respectively at the left and top of a current macro block 41 as shown in FIG. 4.

Figure 5:
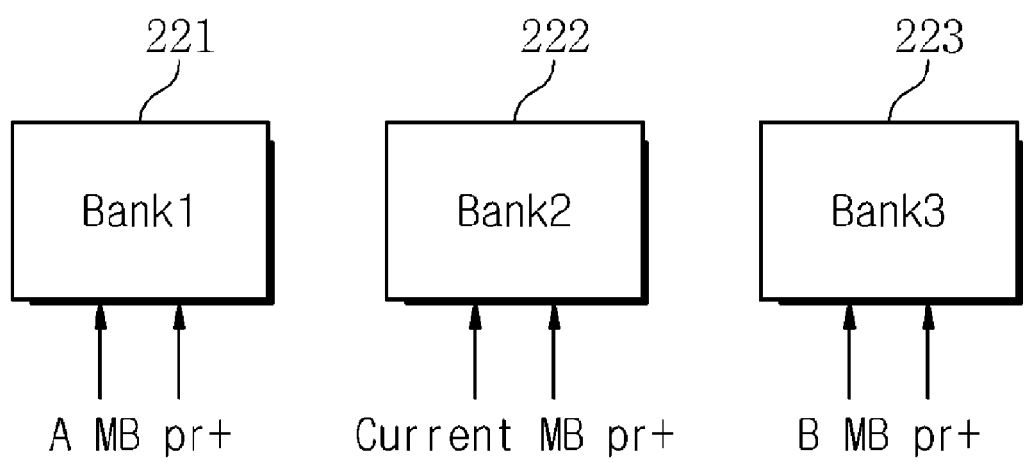
FIG. 5 is a diagram illustrating the structure of register banks for storing a current macro block and neighboring macro blocks, in a CABAC decoding device in accordance with an exemplary embodiment of the present invention.

Based on this standard, information about the current macro block 41 and the neighboring macro blocks 42 and 43 is stored in the register bank 220. For this, the register bank 220 is composed of a plurality of register banks 221~223 as shown in FIG. 5. The register banks 221~223 respectively store the current macro block 41 and the neighboring A and B macro blocks 42 and 42. Indexes (A MB prt, current MB prt, and B MB prt) indicate the banks 221, 222 and 223 in which the current macro block 41 and the neighboring macro blocks 42 and 43 are stored. Particularly, when the next macro block is decoded, an index (A MB prt) indicating the A macro block 42 comes to newly indicate the register bank 222 storing the current macro block 41. Also, the register bank 223 storing the B macro block 43 retrieves information about the next macro block from the memory and then newly stores it.

Although not illustrated, a status register that stores any additive information (e.g., a screen size, a CABAC initialization factor, etc.) necessary for a decoding may be further included. The status register is directly connected to each element of the decoding device.

The address calculator 270 calculates the addresses at which the current macro block 41 and the A and B macro blocks 42 and 43 are stored in the register bank 220. So, the address calculator 270 may be composed of a part for calculating the address of the current macro block and other part for calculating the addresses of the neighboring macro blocks.

Whenever a bin is decoded, the context model value for the context index may be varied. The context updater 260 updates the context model when a binary arithmetic decoding is completed.

The inverse binarization unit 250 collects bits outputted from the binary arithmetic decoder 240 and then checks whether the bits are a valid bit string. If so, the inverse binarization unit 250 performs an inverse binarization and outputs a syntax element value prior to being encoded.

Now, the operation of the above-discussed CABAC decoding device will be described with reference to FIG. 3.

Figure 3:
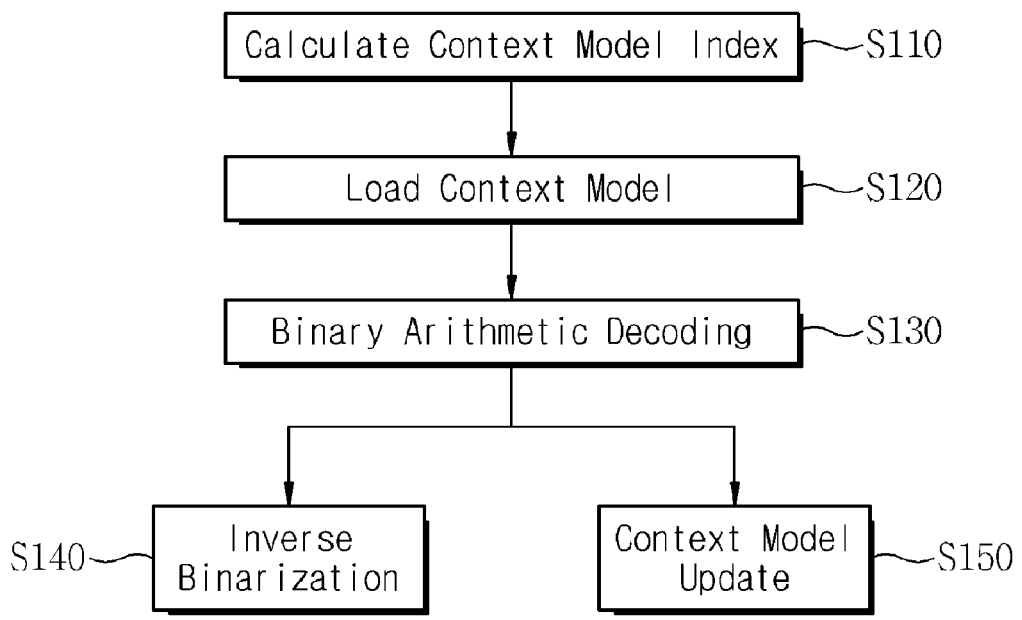
FIG. 3 is a flow diagram illustrating the operation of a CABAC decoding device in accordance with an exemplary embodiment of the present invention.

FIG. 3 is a flow diagram illustrating the operation of a CABAC decoding device in accordance with an exemplary embodiment of the present invention.

Referring to FIG. 3, before performing a decoding process, the CABAC decoding device stores information about the current macro block 41 and information about the neighboring macro blocks 42 and 43 in the register bank 220.

Then the CABAC decoding device performs steps S110 to S130 by the bit for a bit stream stored in the bit stream buffer 210. In the step S110, the context selector 230 checks information about respective locations of the current macro block 41 and neighboring macro blocks 42 and 43, calculated by the address calculator 270. Additionally, referring to information about the current macro block 41 and neighboring macro blocks 42 and 43, the context selector 230 calculates a context index (ctxIdx) corresponding to a matched context model.

Next, in the step S120, the context selector 230 acquires the MPS value indicating the most probable symbol of a context model corresponding to the calculated context index (ctxIdx), and the probability index information indicating the probability of occurrence of the MPS, and then offers them to the binary arithmetic decoder 240.

Then, in the step S130, the binary arithmetic decoder 240 performs a binary arithmetic decoding of an input bit stream for a single bit offered from the bit stream buffer 210, being based on the probability corresponding to a context model.

A binary signal decoded in the binary arithmetic decoder 240 is delivered to the inverse binarization unit 250. In step 140, the inverse binarization unit 250 checks whether a bit string composed of single bit signals outputted from the binary arithmetic decoder 240 is a valid bit string. If so, the inverse binarization unit 250 performs an inverse binarization and outputs a syntax element value prior to being encoded.

Furthermore, whenever a single bit is decoded in the step S130, the context updater 260 checks whether the context model value for the context index is changed, in step 150, and then updates the value of the context model in the context model table.

When any syntax element is decoded and outputted in the step S140, the bit stream buffer 210 receives and stores the next bit stream, and the above-discussed steps are repeated for a bit stream corresponding to the next syntax element value.

If read and write of memory are performed in one cycle, the CABAC decoding device of this invention may perform the above steps S110 to S150 in one cycle.

Since determination according to multiple conditions is based on logic circuits, the CABAC decoding device of this invention allows a simultaneous performing when formed in hardware. Additionally, since the register bank 220 reads and stores information about neighboring macro blocks at a time from the memory when one macro block starts to be decoded, the context selector 230 may not need to access a memory at every operation. This may considerably improve the overall decoding speed.

Meanwhile, since an input received by the inverse binarization unit 250 is only 0 or 1, it is possible to determine in advance which input causes a valid bin string. Therefore, the steps S140 and S150 may be simultaneously performed.

In the CABAC decoding device of this invention, a decoding of n bits requires 3+n cycles on average. Therefore, each syntax element may require 4.2 cycles on average. Additionally, whenever the next macro block starts to be decoded, 25 cycles are required for reading information about the neighboring macro blocks from the memory and for storing information about the previous macro block in the memory. Therefore, the CABAC decoding device of this invention requires on average 1285 cycles (=25+4.2×300) per macro block.

Let's suppose that there is HD video compressed with H.264/AVC CABAC as shown in Table 1 and that approximately half of the total macro blocks are skipped. Then the CABAC decoding device of this invention requires total 13,107,000 cycles in order to decode a frame sequence corresponding to one second. This is enough operation capacity to perform a real-time decoding at the frequency of 150 MHz.

TABLE 1

| profile/level | main profile, level 5.0 |
|---|---|
| frame sequence | 1920 * 1080 25 frames/second |
| bit rate | 37.64 Mbps |
| bits used for CABAC codeword | 36 Mb(96%) |
| # syntax elements | 40,000,000 |
| # bins | 47,000,000 |
| average # of bins per SE skipped macro blocks | 1.2 |
| | 116,188 out of 204,000(57%) |
| average # of SE for non-skipped MBs | 300 |

As fully discussed hereinbefore, the CABAC decoding device of this invention formed in hardware may offer a decoding speed of 150 MHz. This may be effectively employed in H.264 and also applied to a next-generation digital television and the like requiring higher performance. Additionally, this may allow CABAC with higher compression efficiency to be available for SVC (Scalable Video Codec) that offers various layers.

While this invention has been particularly shown and described with reference to an exemplary embodiment thereof, it will be understood by those skilled in the art that various changes in form and details may be made therein without departing from the spirit and scope of the invention as defined by the appended claims.

What is claimed is:

1. A context-based adaptive binary arithmetic coding (CABAC) decoding device comprising:
    a bit stream buffer configured to receive and store a bit stream having a specific size;
    a register bank configured to store a current macro block to be decoded and neighboring macro blocks;
    a context selector configured to have a context model table that contains context indexes and correlated context model values, to calculate the context index that indicates the context model while referring to information about the current macro block and the neighboring macro blocks stored in the register bank, and to select the context model in the context model table by using the calculated context index;
    a binary arithmetic decoder configured to receive the bit stream from the bit stream buffer, to receive the selected context model from the context selector, and to perform a binary arithmetic decoding of the received bit stream according to the received context model; and
    an inverse binarization unit configured to check whether bits outputted from the binary arithmetic decoder are a valid bit string, and if the bit string is valid, to perform an inverse binarization for the bit string and then output a syntax element value.

2. The device of claim 1, further comprising:
    a context updater configured to update the context model in the context model table whenever a single bit is decoded.

3. The device of claim 1, further comprising:
    an address calculator configured to calculate addresses at which the current macro block and the neighboring macro blocks are stored.

4. The device of claim 3, wherein the address calculator includes:
    a first part for calculating the address of the current macro block; and a second part for calculating the addresses of the neighboring macro blocks required for selecting the context model on the basis of the calculated address of the current macro block.

5. The device of claim 1, further comprising:

a status register configured to store additive information necessary for a decoding, the additive information including at least one of a screen size and a CABAC initialization factor.

6. The device of claim 1, wherein the register bank is further configured to read and store information about the current macro block and the neighboring macro blocks at a time from a memory when one macro block starts to be decoded.

7. The device of claim 1, wherein the context model includes a most probable symbol (MPS) value that indicates which of binary signals has a higher probability of occurrence, and probability index information that indicates the probability of occurrence of the MPS.

8. The device of claim 1, wherein the binary arithmetic decoder and the inverse binarization unit simultaneously operate.

* * * * *